US012222619B2

(12) United States Patent
Su et al.

(10) Patent No.: US 12,222,619 B2
(45) Date of Patent: Feb. 11, 2025

(54) DISPLAY PANEL AND DISPLAY DEVICE (71) Applicants: Beijing BOE Display Technology Co., Ltd., Beijing (CN); BOE TECHNOLOGY GROUP CO., LTD., Beijing (CN)

(72) Inventors: Qiujie Su, Beijing (CN); Xiaoyuan Wang, Beijing (CN); Zhihua Sun, Beijing (CN); Li Tian, Beijing (CN); Seungmin Lee, Beijing (CN); Jiantao Liu, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 359 days.

(21) Appl. No.: 17/636,148

(22) PCT Filed: Mar. 10, 2021

(86) PCT No.: PCT/CN2021/079911
§ 371 (c)(1),
(2) Date: Feb. 17, 2022

(87) PCT Pub. No.: WO2021/208643
PCT Pub. Date: Oct. 21, 2021

(65) Prior Publication Data
US 2022/0291558 A1 Sep. 15, 2022

(30) Foreign Application Priority Data
Apr. 14, 2020 (CN) .......................... 202010291154.6

(51) Int. Cl.
*G02F 1/1362* (2006.01)
*G02F 1/1335* (2006.01)
(Continued)

(52) U.S. Cl.
CPC .. *G02F 1/136286* (2013.01); *G02F 1/133514* (2013.01); *G02F 1/1339* (2013.01);
(Continued)

(58) Field of Classification Search
CPC ......... G02F 1/133512; G02F 1/136286; G02F 1/136222; G02F 1/133514; G02F 1/1339; G02F 1/1368
See application file for complete search history.

(56) References Cited

U.S. PATENT DOCUMENTS 10,082,706 B2   9/2018   Kwon
10,732,473 B2   8/2020   Itoo
(Continued)

FOREIGN PATENT DOCUMENTS

CN   103487994 A   1/2014
CN   106855674 A   6/2017
(Continued)

OTHER PUBLICATIONS

International Search Report and Written Opinion for International Application No. PCT/CN2021/079911 mailed Jun. 23, 2021.
(Continued)

*Primary Examiner* — Dung T Nguyen
*Assistant Examiner* — David Y Chung
(74) *Attorney, Agent, or Firm* — Perilla Knox & Hildebrandt LLP; Kenneth A. Knox (57) ABSTRACT

A display panel and a display device are disclosed. The display panel comprises an array substrate and spacers; the array substrate comprises a first substrate, gate lines, data lines, and multiple sub-pixel units; the first substrate is provided with multiple sub-pixel regions, first wiring regions each located between two adjacent rows of sub-pixel regions, and second wiring regions each located between two adjacent columns of sub-pixel regions and intersecting
(Continued)

the first wiring regions; at least part of each sub-pixel unit is located on a sub-pixel region; the gate lines and the data lines are respectively located on the first wiring regions and the second wiring regions and are electrically connected to the sub-pixel units; the data lines and the gate lines are insulated from each other and intersect each other; each data line is provided with an alignment part.

20 Claims, 8 Drawing Sheets

(51) Int. Cl.
  *G02F 1/1339* (2006.01)
  *G02F 1/1368* (2006.01)
  *H01L 27/12* (2006.01)
(52) U.S. Cl.
  CPC ...... *G02F 1/136222* (2021.01); *G02F 1/1368* (2013.01); *H01L 27/124* (2013.01)

(56) References Cited

U.S. PATENT DOCUMENTS

| | | | |
|---|---|---|---|
| 2014/0347586 | A1 | 11/2014 | Wang et al. |
| 2015/0370105 | A1* | 12/2015 | Hong ............... G02F 1/133512 349/110 |
| 2017/0192281 | A1* | 7/2017 | Kwon ............... G02F 1/134309 |
| 2019/0243197 | A1 | 8/2019 | Itoo |
| 2019/0339555 | A1* | 11/2019 | Yoshida ............. G02F 1/13394 |

FOREIGN PATENT DOCUMENTS

| | | |
|---|---|---|
| CN | 110119055 A | 8/2019 |
| CN | 110121675 A | 8/2019 |
| CN | 111338144 A | 6/2020 |
| JP | WO2012124699 A1 | 7/2014 |
| WO | 2012124699 A1 | 9/2012 |

OTHER PUBLICATIONS

First Office Action for CN Patent Application No. 202010291154.6 mailed Jul. 1, 2022.

* cited by examiner

DISPLAY PANEL AND DISPLAY DEVICE

CROSS-REFERENCE TO RELATED APPLICATIONS

The present disclosure is a national phase application under 35 U.S.C. § 371 of International Application No. PCT/CN2021/079911 filed on Mar. 10, 2021, which claims the benefit of and priority to Chinese Patent Application No. 202010291154.6, entitled "Display Panel and Display Device" filed on Apr. 14, 2020, where the contents of both which are hereby incorporated by reference in their entireties herein.

TECHNICAL FIELD

The present disclosure relates to the field of display technology and, in particular, to a display panel and a display device.

BACKGROUND

With the continuous development of liquid-crystal display (LCD) panels, high-resolution products are constantly being developed. However, with the increase of pixels, it is prone to generating a series of problems. For example, when certain pressure tests are performed on the LCD panels, the color film substrate will slide relative to the array substrate, which causes the spacer on the color filter substrate to scratch the alignment (PI) film of the array substrate, causing abnormal liquid crystal alignment and uncontrollable light leakage, which affects the display effect.

It should be noted that the information disclosed in the above BACKGROUND is only used to enhance the understanding of the background of the present disclosure, and therefore may include information that does not constitute the prior art known to those of ordinary skill in the art.

SUMMARY

The purpose of the present disclosure is to provide a display panel and a display device.

According to an aspect of the present disclosure, there is provided a display panel, including:

an array substrate; wherein the array substrate includes a first substrate, gate lines, data lines, and a plurality of sub-pixel units, the first substrate has a plurality of sub-pixel regions arranged in an array, first wiring regions each located between two adjacent rows of sub-pixel regions, and second wiring regions each located between two adjacent columns of sub-pixel regions, the first wiring regions intersect with the second wiring regions; at least part of each of the sub-pixel units is located on one of the sub-pixel regions; the gate lines are located on the first wiring regions and are electrically connected with the sub-pixel units; the data lines are located on the second wiring regions and are electrically connected with the sub-pixel units; the data lines and the gate lines are insulated from each other and orthographic projections of the data line and the gate line on the first substrate intersect with each other; the data line has an alignment part, and an orthographic projection of the alignment part on the first substrate is located in a region where the first wiring region and the second wiring region intersect; and a spacer, disposed on a side of the alignment part away from the array substrate, an orthographic projection of the spacer on the first substrate is located within an orthographic projection of the alignment part on the first substrate.

In an exemplary embodiment of the present disclosure, the data line further has main line parts located on opposite sides of the alignment part in a column direction, an orthographic projection of the main line part on the first substrate and an orthographic projections of the first wiring area on the first substrate do not overlap, and a size of the main line part in a row direction is smaller than that of the alignment part in the row direction.

In an exemplary embodiment of the present disclosure, in a direction from a side of the alignment part close to the main line part to a center of the alignment part, the size of the alignment part in the row direction gradually increases.

In an exemplary embodiment of the present disclosure, a distance between an edge of the orthographic projection of the spacer on the first substrate and an edge of the orthographic projection of the alignment part on the first substrate is a first distance,
  wherein, a ratio between the first distance and the size of the main line part of the data line in the row direction is 50% to 100%.

In an exemplary embodiment of the present disclosure, two gate lines are provided on the first wiring area, and each of the gate lines is electrically connected to at least part of the sub-pixel units in an adjacent row of the sub-pixel units;
  the orthographic projection of the alignment part on the first substrate is located between orthographic projections of the two gate lines on the first substrate.

In an exemplary embodiment of the present disclosure, barrier walls located on opposite sides of the spacer in the column direction are further provided on the first substrate;
  a distance between the barrier wall and the spacer is a second distance;
  wherein, a ratio between the second distance and the size of the main line part of the data line in the row direction is 2.5 to 8.

In an exemplary embodiment of the present disclosure, the data line further has a transition part located between the main line part and the alignment part; orthographic projections of the transition part and the gate line on the first substrate overlap, and an overlapping position is defined as a blocking position;
  the barrier wall includes a portion of the transition part located at the blocking position and a portion of the gate line located at the blocking position.

In an exemplary embodiment of the present disclosure, the alignment part is electrically connected with two adjacent columns of sub-pixel units.

In an exemplary embodiment of the present disclosure, the display panel further includes a color filter substrate, wherein the color filter substrate includes a second substrate located on a side of the spacer away from the array substrate and a shielding layer located on a side of the second substrate close to the array substrate, and the shielding layer has an intersecting shielding part, first shielding parts located on opposite sides of the intersecting shielding part in the row direction, and second shielding parts located on opposite sides of the intersecting shielding part in the column direction; wherein,
  an orthographic projection of the intersecting shielding part on the first substrate at least covers an intersection area of the first wiring area and the second wiring area, and an orthographic projection of the first shielding part on the first substrate at least covers the first wiring area and does not overlap with the second wiring area, and an orthographic projection of the second shielding part on the first substrate at least covers the second wiring area and does not overlap with the first wiring area;

a size of the intersecting shielding part in the column direction is larger than that of the first shielding part in the column direction, and a size of the intersecting shielding part in the row direction is larger than that of the second shielding part in the row direction.

In an exemplary embodiment of the present disclosure, an orthographic projection of the spacer on the second substrate is located in a central area of an orthographic projection of the intersecting shielding part on the second substrate, a distance between an edge of the orthographic projection of the spacer on the first substrate and an edge of the orthographic projection of the intersecting shielding part on the first substrate is a third distance;

wherein, a ratio between the third distance and the size of the main line part of the data line in the row direction is 6.5 to 12.

In an exemplary embodiment of the present disclosure, the shielding layer further has a transition shielding part located between the intersecting shielding part and the first shielding part; opposite end faces between the transition shielding part and the first shielding part completely overlap, and opposite end faces between the transition shielding part and the intersecting shielding part completely overlap.

According to an aspect of the present disclosure, there is provided a display device, including the display panel according to any one of the above.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments in accordance with the disclosure, and explain the principle of the disclosure together with the specification. The drawings in the following description are only some embodiments of the present disclosure. For those of ordinary skill in the art, other drawings can be obtained based on these drawings without creative work.

DETAILED DESCRIPTION

In the following, the technical solutions of the present disclosure will be further described in detail through the embodiments and in conjunction with the accompanying drawings. In the specification, the same or similar reference numerals indicate the same or similar parts. The following description of the embodiments of the present disclosure with reference to the accompanying drawings is intended to explain the general inventive concept of the present disclosure, and should not be construed as a limitation to the present disclosure.

In addition, in the following detailed description, for the convenience of explanation, many specific details are set forth to provide a comprehensive understanding of the embodiments of the present disclosure. However, it is apparent that one or more embodiments can also be implemented without these specific details.

It should be noted that the "on . . . ", "formed on . . . ", and "disposed on . . . " in this disclosure can mean that one layer is directly formed or disposed on another layer, or it can also mean that a layer is indirectly formed or disposed on another layer, that is, there are other layers between the two layers.

The terms "a", "an", "the", "said", and "at least one" are used to indicate the presence of one or more elements/components/etc.; the terms "including" and "having" are used to indicate open-ended inclusive meaning and means that there may be additional elements/components/etc. in addition to the listed elements/components/etc.

It should be noted that although the terms "first", "second", etc. may be used herein to describe various parts, components, elements, regions, layers and/or sections, these parts, components, elements, regions, and layers and/or sections should not be limited by these terms. Rather, these terms are used to distinguish one part, member, element, region, layer, and/or section from another part, member, element, region, layer, and/or section.

In the present disclosure, unless otherwise specified, the adopted term "arranged in the same layer" means that two layers, parts, components, elements, or sections can be formed by the same patterning process, and the two layers, parts, components, elements, or sections are generally formed of the same material.

In the present disclosure, unless otherwise specified, the expression "patterning process" generally includes steps of photoresist coating, exposure, development, etching, and photoresist stripping. The expression "one-time patterning process" means a process of forming patterned layers, parts, components, etc., using one mask.

The reference numerals used in the figures are as follows: 1, array substrate; 10, first substrate; 10a, sub-pixel region; 10b, first wiring area; 10c, second wiring area; 11, data line; 110, alignment part; 111, main line part; 112, transition part; 12, gate line; 13, sub-pixel unit; 130, common electrode; 131, pixel electrode; 1310, slit; 132, thin film transistor; 1320, gate electrode; 1321, active layer; 1322, source electrode; 1323, drain electrode; 14, common line, 15, first insulating layer; 16, second insulating layer; 17, orientation film layer; 18, barrier wall; 2, color filter substrate; 20, second substrate; 21, color filter layer; 22, shielding layer; 220, first shielding part; 221, second shielding part; 222, intersecting shielding part; 223, transition shielding part; 224. light-transmitting hole; 3, spacer; and 4, liquid crystal.

Figure 1:
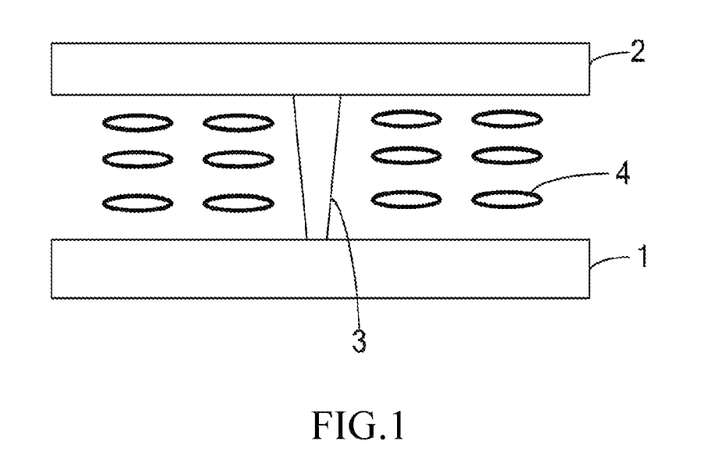
FIG. 1 shows a schematic diagram of a part of the structure of a display panel according to an embodiment of the present disclosure.

An embodiment of the present disclosure provides a display panel, which may be a liquid crystal display panel. As shown in FIG. 1, the display panel may include an array substrate 1 and a spacer 3. In addition, the display panel may also include a color filter substrate 2, where the color filter substrate 2 is located on a side of the spacer 3 away from the array substrate 1. In other words, the spacer 3 can be located between the color filter substrate 2 and the array substrate 1 to support the color filter substrate 2 and the array substrate 1, and the liquid crystals 4 can be located in the space supported by the spacer 3.

As shown in FIGS. 2 and 4 to 6, the array substrate 1 may include a first substrate 10, data lines 11, gate lines 12, and a plurality of sub-pixel units 13 formed on the first substrate 10. Specifically, the first substrate 10 has a plurality of sub-pixel regions 10a arranged in an array, first wiring regions 10b each located between two adjacent rows of sub-pixel regions 10a, and second wiring regions 10c each located between two adjacent columns of sub-pixel regions 10a. The first wiring regions 10b intersect with the second wiring regions 10c; at least part of each of the sub-pixel units 13 is located on one of the sub-pixel regions 10a; the gate lines 12 are located on the first wiring regions 10b and are electrically connected with the sub-pixel units 13; the data lines 11 are located on the second wiring regions 10c and are electrically connected with the sub-pixel units 13; and the data lines 11 and the gate lines 12 are insulated from each other and orthographic projections of the data line 11 and the gate line 12 on the first substrate 10 intersect with each other. Specifically, the orthographic projections of the data line 11 and the gate line 12 on the first substrate 10 intersect in the area where the first wiring area 10b and the second wiring area 10c intersect. It should be understood that the extension directions of the data line 11 and the gate line 12 are different. Specifically, the data line 11 extends in the column direction Y, and the gate line 12 extends in the row direction X. The data line 11 has an alignment part 110, and an orthographic projection of the alignment part 110 on the first substrate 10 is located in a region where the first wiring region 10b and the second wiring region 10c intersect.

It should be understood that the first substrate 10 is mainly used to form structures such as sub-pixel units 13, gate lines 12, and data lines 11, or the like, thereon. In order to facilitate processing these structures to a specific area on the first substrate 10, regions corresponding to these structures may be divided on the first substrate 10 first. For example, the sub-pixel region 10a, the first wiring region 10b, and the second wiring region 10c can be divided on the first substrate 10 first, and then the sub-pixel unit 13 is formed on the sub-pixel region 10a of the first substrate 10, at least the gate lines 12 are formed on the first wiring region 10b, and at least the data lines 11 are formed on the second wiring region 10c. There may be also a plurality of first wiring areas 10b and second wiring areas 10c; in addition, the first substrate 10 may also be provided with other wiring areas besides the first wiring area 10b and the second wiring area 10c, it depends on the specific situation.

As shown in FIGS. 2 and 4 to 6, the spacer 3 is disposed on a side of the alignment part 110 of the data line 11 away from the array substrate 1, and an orthographic projection of the spacer 3 on the first substrate 10 is located within an orthographic projection of the alignment part 110 on the first substrate 10. That is, an outer contour of the orthographic projection of the spacer 3 on the first substrate 10 is located inside an outer contour of the orthographic projection of the alignment part 110 on the first substrate 10, to ensure that the spacer 3 is stably supported on the array substrate 1.

As shown in FIGS. 2, 4 to 6, the color filter substrate 2 may include a second substrate 20 and a shielding layer 22. The second substrate 20 is located on the side of the spacer 3 away from the array substrate 1, and the shielding layer 22 is located on a side of the second substrate 200 close to array substrate.

Figure 4:
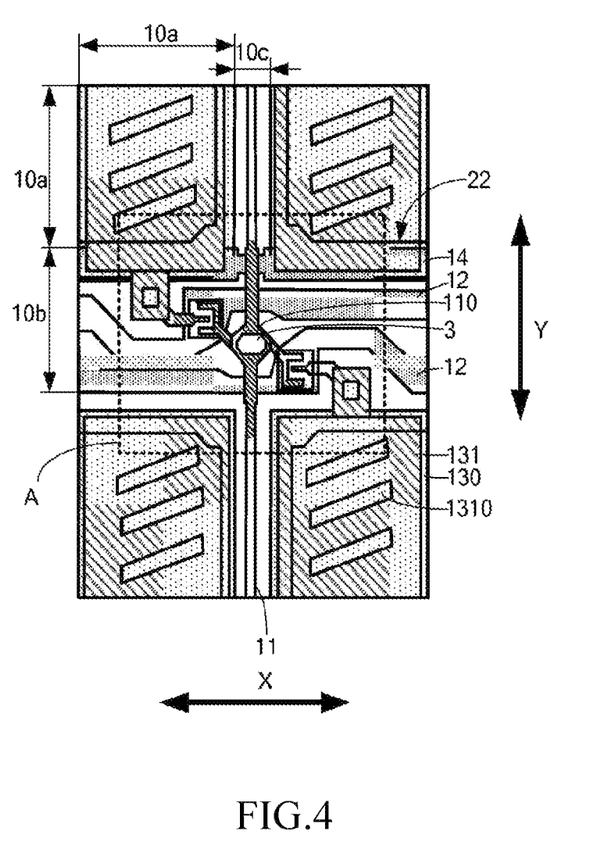
FIG. 4 shows a schematic diagram of a part of the structure of a display panel according to another embodiment of the present disclosure.
Figure 5A:
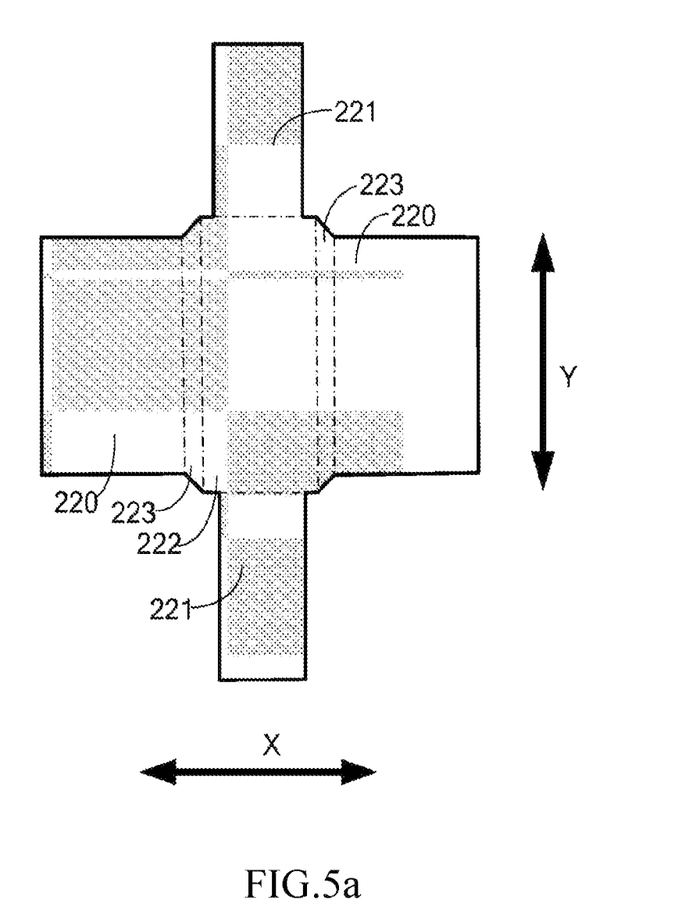
FIG. 5a shows a schematic structural diagram of a shielding layer in the display panel shown in FIG. 4.
Figure 7:
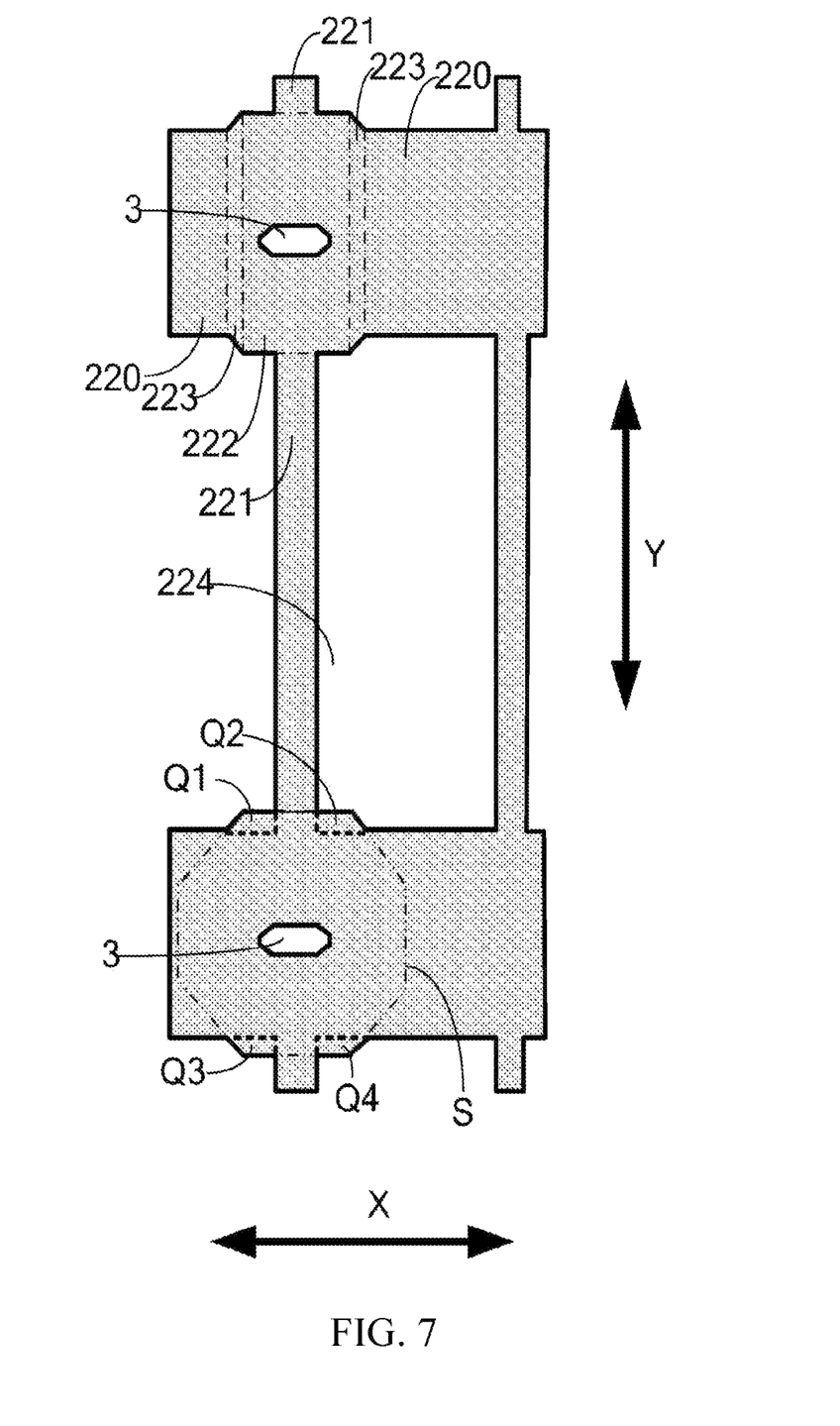
FIG. 7 shows a schematic diagram of the positional relationship between the shielding layer and the spacer in the display panel according to an embodiment of the present disclosure.

As shown in FIGS. 5a and 7, the shielding layer 22 has an intersecting shielding part 222, first shielding parts 220 located on opposite sides of the intersecting shielding part 222 in the row direction X, and second shielding parts 221 located on opposite sides of the intersecting shielding part 222 in the column direction Y. As shown in FIGS. 4 and 5a, an orthographic projection of the intersecting shielding part 222 on the first substrate 10 at least covers an intersection area of the first wiring area 10b and the second wiring area 10c, and an orthographic projection of the first shielding part 220 on the first substrate 10 at least covers the first wiring area 10b and does not overlap with the second wiring area 10c, and an orthographic projection of the second shielding part 221 on the first substrate 10 at least covers the second wiring area 10c and does not overlap with the first wiring area 10b.

The first shielding part 220, the second shielding part 221, and the intersecting shielding part 222 in the shielding layer 22 may be arranged in an array. As shown in FIGS. 4, 5a and 7, the first shielding part 220, the second shielding part 221 and the intersecting shielding part 222 arranged in an array may enclose a light-transmitting hole 224, an orthographic projection of the light-transmitting hole 224 on the first substrate is located in the sub-pixel region 10a, and the light-transmitting hole 224 is used to allow light to pass through. When the entire area of the display panel is constant, the larger the total area of the light-transmitting holes 224 is, that is, the smaller the total area of the shielding part is, the higher the light transmittance of the display panel is, and the better the display effect will be.

It should be noted that in order to ensure that the shielding layer 22 can completely cover the wiring area on the array substrate 1, the orthographic projections of the first shielding part 220, the second shielding part 221 and the intersecting shielding part 222 in the shielding layer 22 on the first substrate can also be made to cover a part of the sub-pixel regions 10a, as shown in FIG. 4.

In the embodiment of the present disclosure, by disposing the spacer 3 on the alignment part 110 in the intersection area of the first wiring area 10b and the second wiring area 10c in the data line 11, when the spacer 3 moves in the row direction X and the column direction Y, the scratches formed on the alignment film layer 17 will also be shielded by the first shielding part 220, the second shielding part 221 and the intersecting shielding part 222 which shield the first wiring area 10b and the second wiring area 10c. This design can alleviate the situation that the spacer 3 slips out of the original light-shielding range during the pressure test, thereby alleviating the light leakage that easily occurs, and then improving the display effect.

Figure 8:
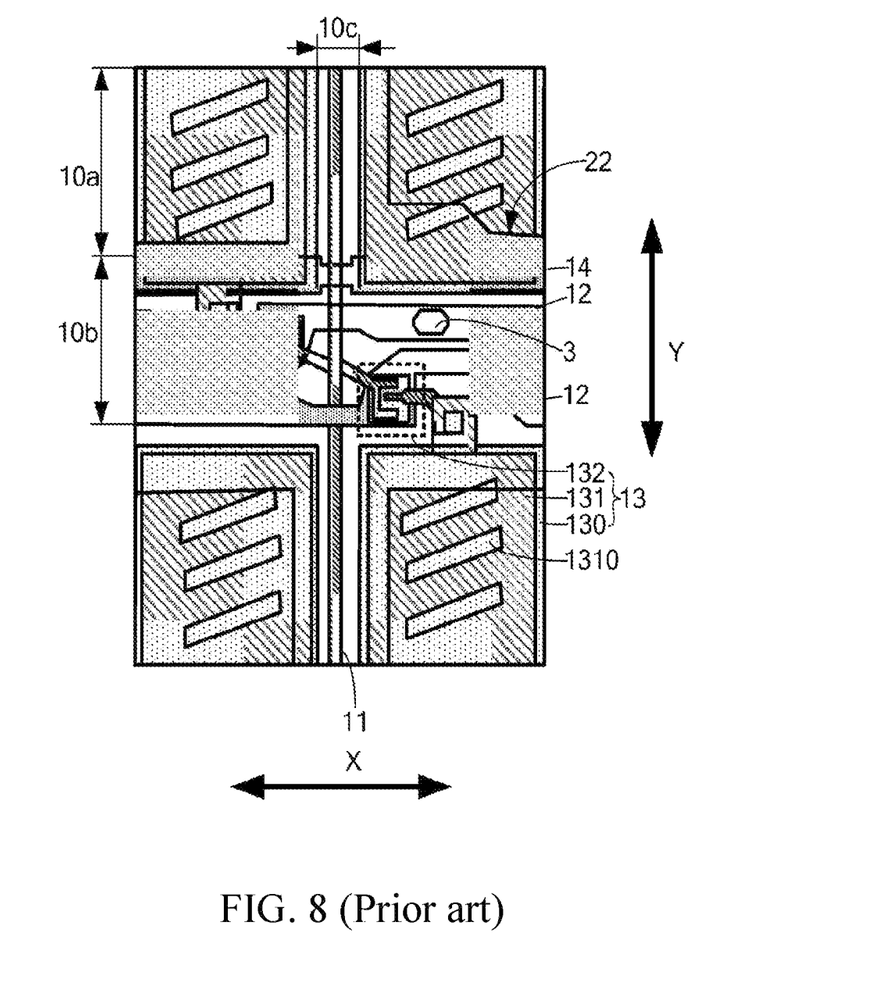
FIG. 8 shows a schematic diagram of a part of the structure of a display panel in the related art.

It should be understood that even if the spacer 3 slides in other directions (that is, directions other than the row direction X and the column direction Y) during the pressure test, since the spacer 3 in the embodiment of the present disclosure is located on the alignment part 110 in the intersection area of the first wiring area 10b and the second wiring area 10c in the data line 11, compared with the scheme of the related art shown in FIG. 8 that the spacer 3 is arranged on the gate line 12 between two adjacent sub-pixel units 13 in the same column which also aims to ensure that the scratches generated during the movement of the spacer 3 can be completely covered, the increased area of the shielding part in the embodiment of the present disclosure is much smaller than the increased area of the shielding part in the related art.

Figure 9A:
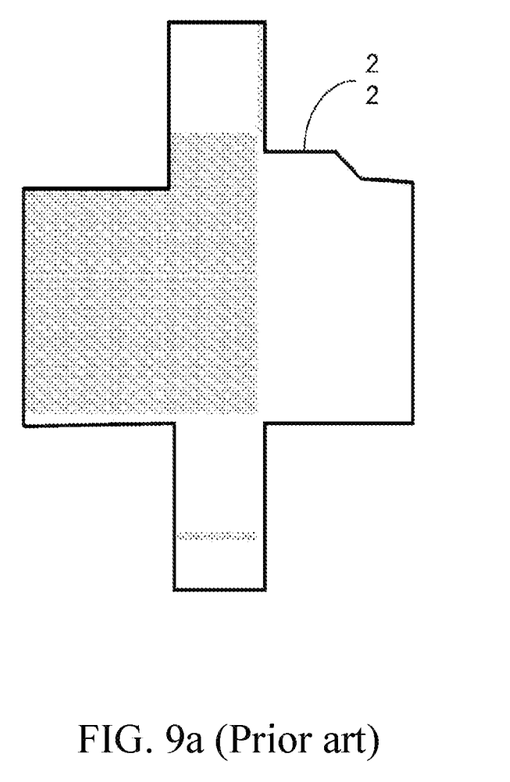
FIG. 9a shows a schematic structural diagram of a shielding layer in the display panel shown in FIG. 8.
Figure 9B:
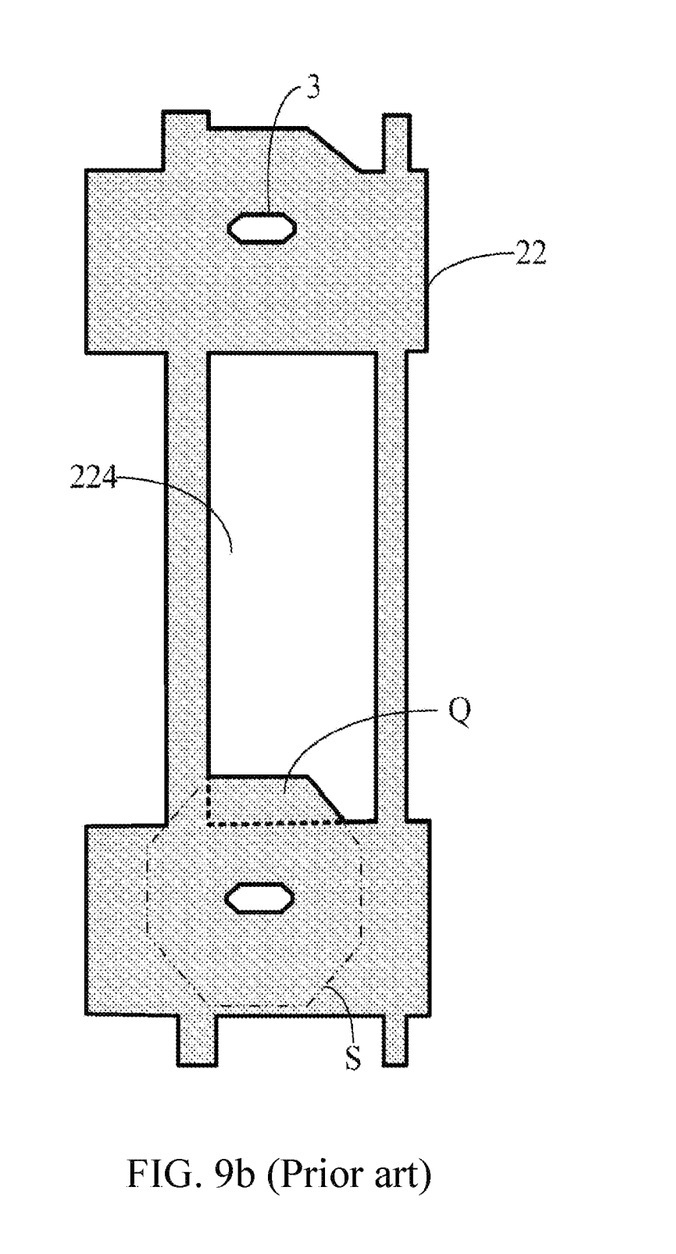
FIG. 9b shows a schematic diagram of the positional relationship between the shielding layer of the display panel and the spacer in the related art.

Specifically, as shown in FIGS. 5a, 7, 9a, and 9b, the area enclosed by the S frame in FIGS. 7 and 9b is the moving area of the spacer 3, and the distance that the spacer 3 moves to the surroundings in this related technical solution is the same as the distance that the spacer 3 moves to the surroundings in the solution described in the embodiment of the present disclosure. In order to ensure that the scratches generated during the movement of the spacer 3 can be completely shielded by the shielding layer 22, both the areas of the shielding part of the shielding layer 22 in the technical solutions in the related art and in the embodiments of the present disclosure are increased. In the embodiment, the sum of the areas of Q1, Q2, Q3, and Q4 in FIG. 7 is the increased area of the shielding part in the embodiment of the present disclosure. The area of Q in FIG. 9b is the increased area of the shielding part in the related art. The area of Q is greater than the sum of areas of Q1, Q2, Q3 and Q4. Therefore, the loss of aperture ratio caused in the embodiment of the present disclosure is significantly less than the loss in the related technical solution.

That is to say, compared with the scheme of the related art shown in FIG. 8 that the spacer 3 is arranged on the gate line 12 between two adjacent sub-pixel units 13 in the same column, the solution of the embodiment of the present disclosure may also increase the pixel aperture ratio, while ensuring that the scratches generated during the movement of the spacer 3 can be completely shielded by the shielding layer 22. The pixel aperture ratio refers to the ratio between the total area of the light-transmitting holes 224 in the shielding layer 22 and the entire area of the display panel.

For example, as for a 55-inch UHD (Ultra High Definition) display product, when the distance that the spacer 3 moves to the surroundings during the stress test is 40 μm to 60 μm, and when the width of the sub-pixel unit 13 is 105 um and the length thereof is 315 um, when the scheme of the related technology is adopted, the aperture ratio is 56.9%; when the scheme described in the embodiment of the present disclosure is adopted, the aperture ratio is 60.9%. Compared with the scheme of the related technology, the absolute value of the aperture ratio is increased by 4% and the relative value thereof is increased by approximately 10.7% in the scheme described in the embodiment of the present disclosure.

It should be noted that the bold dashed line, single-dotted line, double-dotted line in FIG. 7 and the bold dashed line and double-dotted line in FIG. 9b do not have practical meanings. It is only for facilitating those skilled in the art to understand the positions corresponding to each part of the shielding layer 22 and the moving range of the spacer 3.

Figure 6:
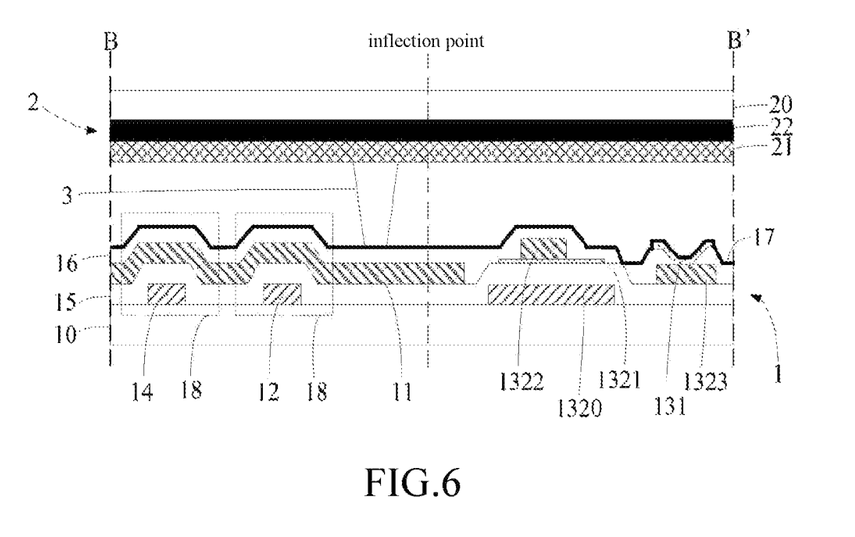
FIG. 6 shows a schematic cross-sectional view of the display panel shown in FIG. 5b in the B-B direction.

In addition, as shown in FIG. 6, since the data line 11 is usually closer to the spacer 3 than the gate line 12, for example, the data line 11 is usually arranged in the same layer as the source and drain electrodes of the thin film transistor in the array substrate 1, and the gate line 12 is usually arranged in the same layer as the gate electrode of the thin film transistor in the array substrate 1, in the embodiment of the present disclosure, the spacer 3 is adopted to align with the data line 11, that is, the spacer 3 is arranged above the data line 11. Compared with the solution in the related art in which the spacer 3 is arranged above the gate line 12, the alignment accuracy can be improved, thereby ensuring the assembly yield of the display panel.

The display panel described in the embodiments of the present disclosure will be described in detail below with reference to the accompanying drawings.

In some embodiments, as shown in FIG. 6, the first substrate 10 in the array substrate 1 may have a single-layer structure, and the material of the first substrate 10 may be glass. But it is not limited to this, the first substrate 10 may also have a multilayer structure; and the material of the first substrate 10 is not limited to glass, and may also be other materials, such as polyimide and other materials, depending on the specific situation.

Figure 2:
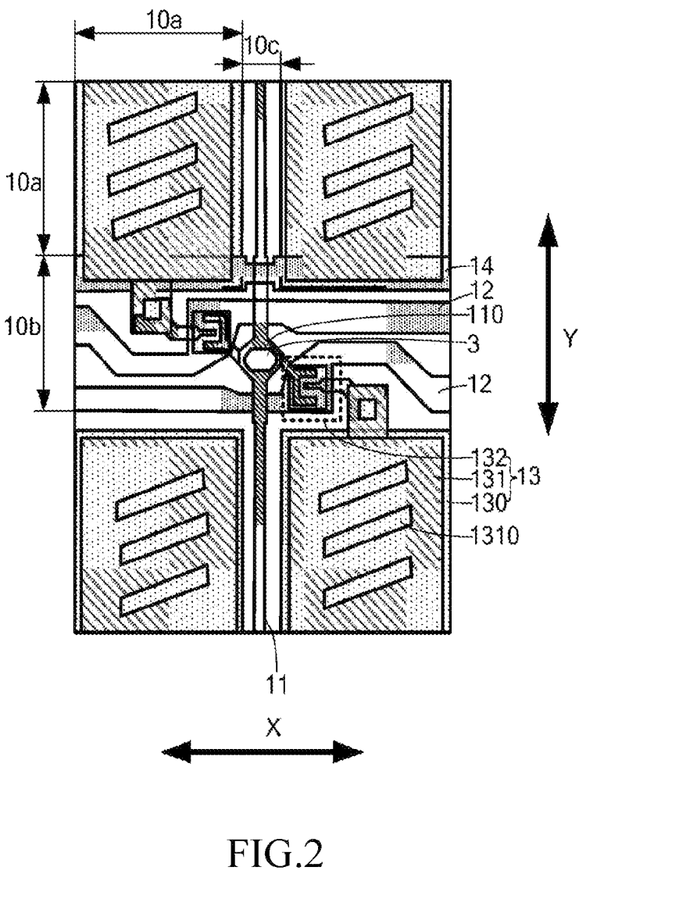
FIG. 2 shows a schematic diagram of the positional relationship between the array substrate and the spacer in the display panel according to an embodiment of the present disclosure.
Figure 3:
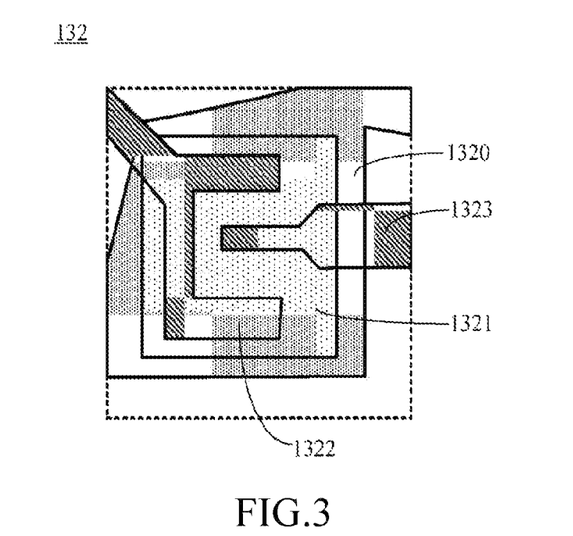
FIG. 3 shows a schematic diagram of the structure of a thin film transistor in the array substrate shown in FIG. 2.

As shown in FIGS. 2 to 6, the sub-pixel unit 13 may include a common electrode 130, a pixel electrode 131, and a thin film transistor 132. The thin film transistor 132 may include a gate electrode 1320, an active layer 1321, a source electrode 1322, and a drain electrode 1323. As shown in FIGS. 2, 3, and 5b, the gate electrode 1320 may belong to a part of the gate line 12, but it is not limited to this. The gate electrode 1320 may also be arranged independently of the gate line 12, and the gate electrode 1320 of the thin film transistor 132 may be arranged in the same layer as the gate line 12. It should be noted that there may be a plurality of thin film transistors 132 in the sub-pixel unit 13, and the sub-pixel unit 13 may also include a capacitor structure, which is not shown in the figure.

In addition, it should be understood that, as shown in FIG. 6, a first insulating layer 15 may be further provided between the gate electrode 1320 and the active layer 1321, to insulate the gate electrode 1320 and the active layer 1321 from each other. The first insulating layer 15 may be made of inorganic materials, for example, silicon oxide, silicon nitride and other inorganic materials.

Figure 5B:
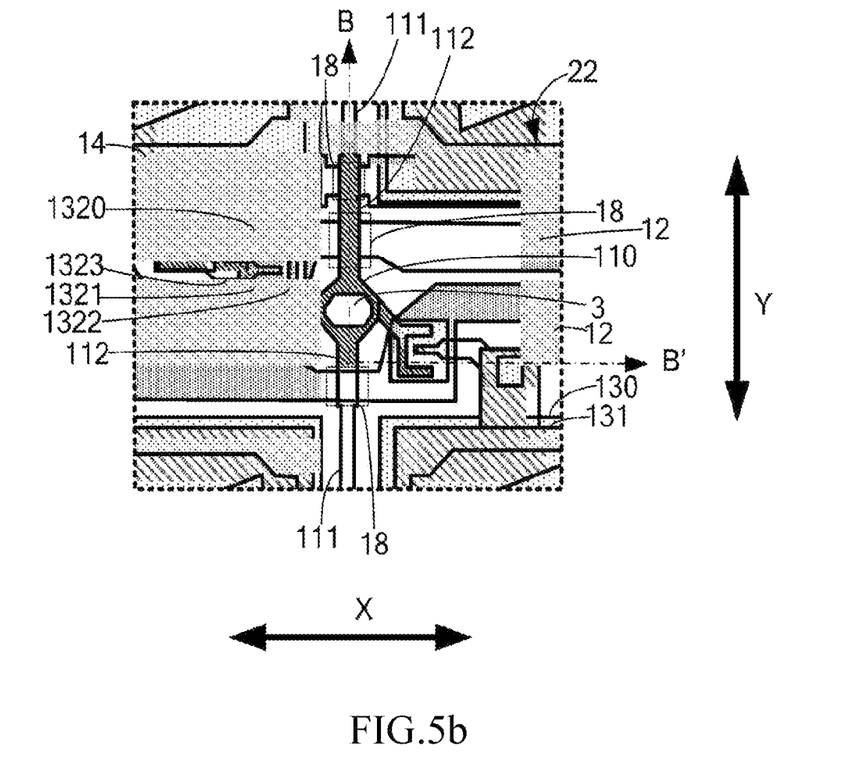
FIG. 5b shows a schematic diagram of an enlarged structure of part A in the display panel shown in FIG. 4.

The thin film transistor 132 may be a top gate type or a bottom gate type. In the embodiments of the present disclosure, the thin film transistor 132 of a bottom-gate type is taken as an example for description. As shown in FIGS. 5b and 6, when the thin film transistor 132 is of a bottom gate type, the gate electrode 1320 is formed on the first substrate 10. The gate electrode 1320 may include metal materials or alloy materials, such as molybdenum, aluminum, and titanium, etc., in order to ensure its good electrical conductivity; the first insulating layer 15 is formed on the first substrate 10 and covers the gate electrode 1320, the first insulating layer 15 can be made of inorganic materials, such as silicon oxide, silicon nitride and other inorganic materials; the active layer 1321 is formed on the side of the first insulating layer 15 away from the first substrate 10, the source electrode 1322 and the drain electrode 1323 are respectively connected to two doped regions of the active layer 1321, the source electrode 1322 and the drain electrode 1323 may include a metal material or an alloy material, such as a metal single-layer or multi-layer structure formed of molybdenum, aluminum, titanium, etc., for example, the multi-layer structure is a multi-metal laminated layer, such as a three-layer metal laminated layer (Al/Ti/Al) of titanium, aluminum, and titanium, etc.

In order to ensure the light transmittance of the array substrate 1, the common electrode 130 can be made of transparent materials such as ITO (Indium Tin Oxide), Indium Zinc Oxide (IZO), and Zinc Oxide (ZnO); that is, since the materials adopted by the common electrode 130 are different from those of the gate electrode 1320, source electrode 1322, drain electrode 1323 of the thin film transistor 132, the common electrode 130 and the gate electrode 1320, source electrode 1322, drain electrode 1323 of the thin film transistor 132 can be manufactured by adopting different patterning processes.

For example, the common electrode 130 of this embodiment can be formed on the first substrate 10 before the gate electrode 1320 of the thin film transistor 132 is formed. That is to say, when the array substrate 1 is manufactured, the common electrode 130 is formed on a first substrate 10 by adopting a patterning process first, and then a gate electrode 1320 of the thin film transistor 132 is formed on the first substrate 10 by adopting another patterning process. It should be noted that although the common electrode 130 and the gate electrode 1320 are both formed on the first substrate 10, the common electrode 130 and the gate electrode 1320 are disconnected from each other, that is, there is no electrical connection between the common electrode 130 and the gate electrode 1320.

However, it should be understood that when the material of the gate electrode 1320 and the material of the common electrode 130 are the same, the gate electrode 1320 and the common electrode 130 can also be formed on the first substrate 10 at the same time by using one-time patterning process. In addition, the common electrode 130 may not only be formed on the first substrate 10 before the gate electrode 1320 of the thin film transistor 132 is formed, but also may be formed after the gate electrode 1320 of the thin film transistor 132 is formed, which depends on the specific situation.

Similarly, in order to ensure the light transmittance of the array substrate 1, the pixel electrode 131 can also be made of transparent materials such as ITO (Indium Tin Oxide), Indium Zinc Oxide (IZO), and Zinc Oxide (ZnO), etc.; the pixel electrode 131 can be formed on the side of the source electrode 1322, the drain electrode 1323 away from the first substrate 10; as shown in FIGS. 5b and 6, the pixel electrode 131 can be connected to the drain electrode 1323. It should be understood that after the drain electrode 1323 and the drain electrode 1323 are formed, and before the pixel electrode 131 is formed, a second insulating layer 16 can further be formed. In order to realize the connection between the pixel electrode 131 and the drain electrode 1323, a hole can be made on the second insulating layer 16 and the hole can expose the surface of the drain electrode 1323, and the pixel electrode 131 can be electrically connected to the drain electrode 1323 through the hole.

For example, the pixel electrode 131 and the common electrode 130 may be oppositely designed in a direction perpendicular to the first substrate 10. As shown in FIGS. 2 and 4, the pixel electrode 131 may be a slit electrode, that is, a slit 1310 is provided on the electrode, while the common electrode 130 can be a plate electrode (that is, the electrode is a whole piece without slits). The electric field generated by the pixel electrode 131 and the electric field generated between the common electrodes 130 in the same plane form a multi-dimensional electric field, so that all the liquid crystal molecules between the electrodes and directly above the electrodes are deflected, which can improve the operating efficiency of the liquid crystal and increase the light transmission efficiency. But it is not limited to this, the pixel electrode 131 and the common electrode 130 can also be set as other structures, depending on the specific situation.

In addition, it should be noted that the positional relationship between the common electrode 130 and the pixel electrode 131 is not limited to being located on the same substrate as mentioned above, and they also may not be on the same substrate. For example, the pixel electrode 131 may be located on the array substrate 1, while the common electrode 130 may be located on the color filter substrate 2, depending on the specific situation.

As shown in FIGS. 5b and 6, the data line 11 can be arranged in the same layer as the source electrode 1322 and the drain electrode 1323 of the thin film transistor 132, and electrically connected to the source electrode 1322, but it is not limited to this. The data line 11 can also be arranged in the same layer as other electrodes, depending on the specific situation. For example, the data line 11 may include metal materials or alloy materials, such as molybdenum, aluminum, titanium, etc., to ensure good electrical conductivity.

As shown in FIG. 5b, in addition to the alignment part 110, the data line 11 may also have main line parts 111 located on opposite sides of the alignment part 110 in the column direction Y, and the main line parts 111 are located between two adjacent columns of sub-pixel units 13. As shown in FIGS. 4 and 5b, the orthographic projection of the main line 111 on the first substrate 10 is located outside the intersection area of the first wiring area 10b and the second wiring area 10c, that is, the orthographic projections of the main line part 111 and the first wiring area 10b on the first substrate 10 do not overlap; wherein a size of the main line part 111 in a row direction X is smaller than that of the alignment part 110 in the row direction X.

In the embodiment of the present disclosure, the size of the alignment part 110 in the data line 11 in the row direction X is designed to be larger, such that the spacer 3 and the data line 11 can be aligned; the size of the main line part 111 in the data line 11 in the row direction X is designed to be smaller, such that the area covered by the shielding part can be reduced, thereby increasing the pixel aperture ratio.

In the embodiment, in a direction from the side of the alignment part 110 close to the main line part 111 to the center of the alignment part 110, the size of the alignment part 110 in the row direction X gradually increases. This design ensures that the alignment part 110 has a sufficient area for alignment with the spacer 3, and also avoids the area of the alignment part 110 too large, thereby affecting the arrangement of other structures. For example, the shape of the orthographic projection of the alignment part 110 on the first substrate 10 may be similar to a rhombus, an ellipse, or other polygons, etc., depending on the specific situation.

It should be noted that, in the column direction Y, the size of the main line part 111 of the data line 11 in the row direction X is basically unchanged.

Optionally, a distance between an edge of the orthographic projection of the spacer 3 on the first substrate 10 and an edge of the orthographic projection of the alignment part 110 on the first substrate 10 is a first distance, a ratio between the first distance and the size of the main line part 111 of the data line 11 in the row direction X is 50% to 100%; for example, the size of the main line part 111 of the data line 11 in the row direction X is 5 µm to 6 µm, and the distance (i.e., the first distance) between an edge of the orthographic projection of the spacer 3 on the first substrate 10 and an edge of the orthographic projection of the alignment part 110 on the first substrate 10 may be 3 µm to 5 µm, such as 3 µm, 4 µm, 5 µm, etc., to meet the requirements of alignment deviation. It should be noted that the distance between an edge of the orthographic projection of the spacer 3 on the first substrate 10 and an edge of the orthographic projection of the alignment part 110 on the first substrate 10 is not limited to 3 µm to 5 µm, and it may be more than 5 µm, etc., depending on the alignment deviation of the color filter substrate 2 and the array substrate 1 in the production line.

In addition, as shown in FIGS. 4 and 5b, the data line 11 further has a transition part 112 located between the main line part 111 and the alignment part 110, the orthographic projection of the transition part 112 on the first substrate 10 can be located on the intersection area of the first wiring area 10b and the second wiring area 10c, but not limited to this, the orthographic projection of the portion of the transition part 112 on the first substrate 10 may also be located on the second wiring area 10c and do not overlap with the first wiring area 10b.

As shown in FIG. 5b, the size of the transition part 112 in the row direction X may be slightly larger than the size of the main line part 111 in the row direction X, and smaller than the size of the alignment part 110 in the row direction X, but it is not limited to this. The size of the transition part 112 in the row direction X may also be equal to the size of the main line part 111 in the row direction X.

It should be noted that, as shown in FIGS. 4 and 5b, the orthographic projection of the alignment part 110 of the data line 11 on the first substrate 10 and the orthographic projection of the gate line 12 located on the first wiring area 10b on the first substrate 10 do not overlap, and the orthographic projection of the transition part 112 on the first substrate 10 overlaps with the orthographic projection of the gate line 12 located on the first wiring area 10b on the first substrate 10. Since the size of the transition part 112 in the row direction X is smaller than the size of the alignment part 110 in the row direction X, this design can reduce the overlapping area between the data line 11 and the gate line 12, thereby reducing the capacitance between the gate line 12 and the data line 11 and then ensuring the performance of the array substrate 1.

Since the area of the alignment part 110 is relatively large, as shown in FIG. 5b, the alignment part 110 is electrically connected with the drain electrodes 1323 of the sub-pixel units 13 of two adjacent columns, so as to realize the electrical connection of the data line 11 and the sub-pixel units 13 of two adjacent columns. This design can reduce the difficulty of the process while ensuring the reliable electrical connection between the data line 11 and the sub-pixel units 13 of two adjacent columns.

In some embodiments, as shown in FIGS. 2, 4, and 5b, two gate lines 12 may be provided on the first wiring area 10b on the first substrate 10; each gate line and at least part of the sub-pixel units 13 of its adjacent row are electrically connected.

In addition, as shown in FIGS. 2, 4, and 5b, the first wiring area 10b can also be provided with a common line 14. This common line 14 can be provided in the same layer as the gate line 12, and is connected to the common electrode 130 of each sub-pixel unit 13 in a row of the sub-pixel units 13, to realize the electrical connection between the common line 14 and the common electrode 130.

It should be understood that, in order to facilitate the connection of the sub-pixel unit 13 with the data line 11, the gate line 12 and the common line 14, part of the sub-pixel units 13 may be located in the first wiring area 10b, as shown in FIGS. 2 and 4.

As shown in FIGS. 2, 4, and 5b, when two gate lines 12 are provided in the first wiring area 10b, the orthographic projection of the alignment part 110 of the data line 11 on the first substrate 10 is located between the orthographic projections of the two gate lines on the first substrate 10, this design not only reduces the overlapping area between the data line 11 and the two gate lines 12, but also makes the alignment part 110 of the data line 11 as close as possible to the center position of the intersection area of the first wiring area 10b and the second wiring area 10c, that is, it ensures that the spacer 3 is as close as possible to the center position of the intersection area of the first wiring area 10b and the second wiring area 10c, so as to prevent the spacer 3 from sliding out of the shielding range of the intersecting shielding part 222 during the pressure test.

In some embodiments, as shown in FIGS. 5b and 6, when the spacer 3 is formed on the color filter substrate 2, barrier walls 18 located on opposite sides of the spacer 3 in the column direction Y are further provided on the first substrate 10, the surface of the barrier wall 18 that is far away from the first substrate 10 is farther from the first substrate 10 than the surface of the spacer 3 that is close to the first substrate 10, and is closer to the first substrate 10 than the surface of the spacer 3 that is far away from the first substrate 10. In the embodiment of the present disclosure, the sliding displacement of the spacer 3 in the column direction Y can be limited by setting the barrier wall 18, so as to prevent the spacer 3 from sliding out of the shielded area during the pressure test.

It should be understood that the embodiments of the present disclosure are not limited to providing barrier walls 18 on opposite sides of the spacer 3 in the column direction Y, and barrier walls 18 may also be provided in the row direction X or other directions.

Optionally, a distance between the barrier wall 18 and the spacer 3 is a second distance, a ratio between the second distance and the size of the main line part 111 of the data line 11 in the row direction X is 2.5 to 8; for example, the size of the main line part 111 of the data line 11 in the row direction X is 5 μm to 6 μm; the distance (i.e., the second distance) between the barrier wall 18 and the spacer 3 can be 15 μm to 40 μm, for example, 15 μm, 20 μm, 25 μm, 30 μm, 35 μm, 40 μm. By designing the distance between the barrier wall 18 and the spacer 3 to be greater than or equal to 15 μm, it can avoid the situation that the barrier wall 18 cannot prevent the spacer 3 from sliding due to the excessively small distance; by designing the distance between the barrier wall 18 and the spacer 3 to be less than or equal to 40 μm, it can avoid that the setting of the barrier wall 18 becomes meaningless due to the excessively large distance.

In some embodiments, as shown in FIGS. 5b and 6, orthographic projections of the transition part 112 of the data line 11 and the gate line 12 on the first substrate 10 overlap, and an overlapping position may be defined as a blocking position; wherein the barrier wall 18 may include a portion of the transition part 112 located at the blocking position and a portion of the gate line 12 located at the blocking position. That is, the barrier wall 18 of the embodiment of the present disclosure may be formed by a part where the data line 11 and the gate line 12 overlap, such design does not need to set the barrier wall 18 through other processes, which can reduce the processing cost.

As shown in FIGS. 5b and 6, the orthographic projections of the transition part 112 of the data line 11 and the common line 14 on the first substrate 10 overlap, and the overlapping portion may also form the barrier wall 18.

It should be understood that the data line 11 and the source electrode 1322, the drain electrode 1323 of the thin film transistor 132 are arranged in the same layer, the gate line 12, the common line 14 and the gate electrode 1320 of the thin film transistor 132 are arranged in the same layer, therefore, a first insulating layer 15 is also provided between the overlapping parts between the data line 11, and the gate line 12, the common line 14, that is to say, in addition to the portion of the transition part 112 located at the blocking position and the portion of the gate line 12 (common line 14)

located at the blocking position, the retaining wall 18 may also include a portion of the first insulating layer 15 located at the blocking position; in addition, it may also include the portion of the second insulating layer 16 located at the blocking position.

In some embodiments, as shown in FIG. 7, a size of the intersecting shielding part 222 of the shielding layer 22 in the color filter substrate 2 in the column direction Y is larger than that of the first shielding part 220 in the column direction Y, and a size of the intersecting shielding part 222 in the row direction X is larger than that of the second shielding part 221 in the row direction X; this design can prevent the spacer 3 from slipping out of the shielded area during the pressure test.

Optionally, as shown in FIG. 7, an orthographic projection of the spacer 3 on the second substrate 20 is located in a central area of an orthographic projection of the intersecting shielding part 222 on the second substrate 20, and a distance between an edge of the orthographic projection of the spacer 3 on the first substrate 10 and an edge of the orthographic projection of the intersecting shielding part 222 on the first substrate 10 is a third distance, a ratio between the third distance and the size of the main line part 111 of the data line 11 in the row direction X is 6.5 to 12; for example, the size of the main line part 111 of the data line 11 in the row direction X is 5 μm to 6 μm; the distance (i.e., the third distance) between an edge of the orthographic projection of the spacer 3 on the first substrate 10 and an edge of the orthographic projection of the intersecting shielding part 222 on the first substrate 10 may be 40 μm to 60 μm, such as 40 μm, 45 μm, 50 μm, 55 μm, 60 μm, etc., in order to prevent the spacer 3 from slipping out of the shielded area during the pressure test.

In the embodiment, the shielding layer 22 further has a transition shielding part 223 located between the intersecting shielding part 222 and the first shielding part 220; in a direction from the first shielding part 220 to the intersecting shielding part 222, the size of the transition shielding part 223 in the column direction Y gradually increases; wherein opposite end faces between the transition shielding part 223 and the first shielding part 220 completely overlap, and opposite end faces between the transition shielding part 223 and the intersecting shielding part 222 completely overlap; by providing the transition shielding part, while preventing the spacer 3 from sliding out of the shielded area during the stress test, the shielding area of the shielding layer 22 can also be reduced, thereby increasing the pixel aperture ratio.

The color filter substrate 2 can also be provided with a color filter layer 21, the color filter layer 21 can be formed on the side of the shielding layer 22 away from the second substrate 20, and the color filter layer 21 can include filter structures of red, green, blue, and other colors arranged in an array.

In some embodiments, the spacer 3 can be formed on the color filter substrate 2 first, and then the color filter substrate 2 and the array substrate 1 are aligned. However, it is not limited to this. The spacer 3 can also be formed on the array substrate 1 first, and then the color filter substrate 2 and the array substrate 1 are aligned.

There may be a plurality of spacers 3, and the arrangement of the plurality of spacers 3 can improve the uniformity of the overall thickness of the display panel, increase the tolerance of the display panel to fluctuations of the liquid crystals 4, and thereby improve the yield of the display panel. The plurality of spacers can include a main spacer and an auxiliary spacer. The main spacer can be a spacer 3 as shown in FIG. 6. When the display panel does not receive external pressure, two ends of the main spacer can be in contact with the array substrate 1 and the color filter substrate 2 respectively, and mainly play a supporting role; while as for the auxiliary spacer (not shown in the figure), when the display panel does not receive external pressure, if the auxiliary spacer is formed on the color filter substrate 2, there is a certain distance between the auxiliary spacer and the array substrate 1, that is, there is a step difference (height difference) between the main spacer and the auxiliary spacer. By adjusting the step difference between the main spacer and the auxiliary spacer, the thickness of the display panel can be fine-tuned. For example, the height of the main spacer is greater than the height of the auxiliary spacer. When the display panel is subjected to external pressure, the main spacer bears all the pressure first and is compressed. When the main spacer is compressed to the situation when the step difference between the main spacer and the auxiliary spacer drops to 0, the main spacer and the auxiliary spacer can bear the external pressure together.

In addition, it should be noted that the position of the spacer 3 is selectively arranged, and it is not necessary for the spacer 3 to be arranged in each intersection area of the first wiring area 10*b* and the second wiring area 10*c* in the array substrate 1, in this way, the alignment part 110 is not provided at the each of the intersection area of the first wiring region 10*b* and the second wiring region 10*c* in the data line, and the specific number and position of the spacer 3 can be determined according to actual requirements.

An embodiment of the present disclosure also provides a display device, which includes the display panel described in any of the foregoing embodiments. The display device may be a liquid crystal display device.

According to the embodiments of the present disclosure, the specific type of the display device is not particularly limited. The types of display devices commonly used in the field can be used, such as liquid crystal display screens, mobile devices such as mobile phones, laptop computers, wearable devices such as watches, and VR devices, etc., which can be selected by those skilled in the art according to the specific purpose of the display device, which will not be repeated herein.

It should be noted that in addition to the display panel, the display device also includes other necessary parts and components. Taking the display as an example, it may also include a backlight module, a housing, a main circuit board, power cords, etc., those skilled in the art can make corresponding supplements according to the specific use requirements of the display device, which will not be repeated herein.

Those skilled in the art will easily think of other embodiments of the present disclosure after considering the specification and practicing the disclosure disclosed herein. This disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are only regarded as exemplary, and the true scope and spirit of the present disclosure are indicated by the appended claims.

What is claimed is:

1. A display panel, comprising:
   an array substrate, wherein the array substrate comprises a first substrate, gate lines, data lines, and a plurality of sub-pixel units, the first substrate has a plurality of sub-pixel regions arranged in an array, first wiring regions each located between two adjacent rows of sub-pixel regions, and second wiring regions each located between two adjacent columns of sub-pixel regions, the first wiring regions intersect with the second wiring regions;

wherein at least part of each of the sub-pixel units is located on one of the sub-pixel regions, the gate lines are located on the first wiring regions and are electrically connected with the sub-pixel units, the data lines are located on the second wiring regions and are electrically connected with the sub-pixel units, the data lines and the gate lines are insulated from each other and orthographic projections of the data line and the gate line on the first substrate intersect with each other, the data line has an alignment part, and an orthographic projection of the alignment part on the first substrate is located in a region where the first wiring region and the second wiring region intersect, wherein the data line further has main line parts located on opposite sides of the alignment part in a column direction, the data line further has a transition part located between the main line part and the alignment part, and a size of the transition part in a row direction is larger than that of the main line part in the row direction and smaller than that of the alignment part in the row direction; and a spacer disposed on a side of the alignment part away from the array substrate, wherein an orthographic projection of the spacer on the first substrate is located within an orthographic projection of the alignment part on the first substrate, wherein barrier walls located on opposite sides of the spacer in the column direction are further provided on the first substrate, and a distance between the barrier wall and the spacer is a second distance between 15 μm and 40 μm, and wherein the first wiring area is further provided with a common line, and an overlapping portion of orthographic projections of the transition part and the common line on the first substrate forms another barrier wall.

2. The display panel according to claim 1, wherein an orthographic projection of the main line part on the first substrate and an orthographic projections of the first wiring area on the first substrate do not overlap, and a size of the main line part in the row direction is smaller than that of the alignment part in the row direction.

3. The display panel according to claim 2, wherein, in a direction from a side of the alignment part close to the main line part to a center of the alignment part, the size of the alignment part in the row direction gradually increases.

4. The display panel according to claim 2, wherein:
a distance between an edge of the orthographic projection of the spacer on the first substrate and an edge of the orthographic projection of the alignment part on the first substrate is a first distance; and
a ratio between the first distance and the size of the main line part of the data line in the row direction is 50% to 100%.

5. The display panel according to claim 2, wherein:
two gate lines are provided on the first wiring area, and each of the gate lines is electrically connected to at least part of the sub-pixel units in an adjacent row of the sub-pixel units; and
the orthographic projection of the alignment part on the first substrate is located between orthographic projections of the two gate lines on the first substrate.

6. The display panel according to claim 5, wherein:
a ratio between the second distance and the size of the main line part of the data line in the row direction is 2.5 to 8.

7. The display panel according to claim 6, wherein:
orthographic projections of the transition part and the gate line on the first substrate overlap, and an overlapping position is defined as a blocking position; and
the barrier wall comprises a portion of the transition part located at the blocking position and a portion of the gate line located at the blocking position.

8. The display panel according to claim 2, wherein the alignment part is electrically connected with two adjacent columns of sub-pixel units.

9. The display panel according to claim 2, further comprising a color filter substrate, wherein the color filter substrate comprises a second substrate located on a side of the spacer away from the array substrate and a shielding layer located on a side of the second substrate close to the array substrate, and the shielding layer has an intersecting shielding part, first shielding parts located on opposite sides of the intersecting shielding part in the row direction, and second shielding parts located on opposite sides of the intersecting shielding part in the column direction, wherein:
an orthographic projection of the intersecting shielding part on the first substrate at least covers an intersection area of the first wiring area and the second wiring area, and an orthographic projection of the first shielding part on the first substrate at least covers the first wiring area and does not overlap with the second wiring area, and an orthographic projection of the second shielding part on the first substrate at least covers the second wiring area and does not overlap with the first wiring area; and
a size of the intersecting shielding part in the column direction is larger than that of the first shielding part in the column direction, and a size of the intersecting shielding part in the row direction is larger than that of the second shielding part in the row direction.

10. The display panel according to claim 9, wherein:
an orthographic projection of the spacer on the second substrate is located in a central area of an orthographic projection of the intersecting shielding part on the second substrate;
a distance between an edge of the orthographic projection of the spacer on the first substrate and an edge of the orthographic projection of the intersecting shielding part on the first substrate is a third distance; and
a ratio between the third distance and the size of the main line part of the data line in the row direction is 6.5 to 12.

11. The display panel according to claim 9, wherein the shielding layer further has a transition shielding part located between the intersecting shielding part and the first shielding part; opposite end faces between the transition shielding part and the first shielding part completely overlap, and opposite end faces between the transition shielding part and the intersecting shielding part completely overlap.

12. A display device, comprising:
a display panel, comprising:
an array substrate, wherein the array substrate comprises a first substrate, gate lines, data lines, and a plurality of sub-pixel units, the first substrate has a plurality of sub-pixel regions arranged in an array, first wiring regions each located between two adjacent rows of sub-pixel regions, and second wiring regions each located between two adjacent columns of sub-pixel regions, the first wiring regions intersect with the second wiring regions; at least part of each of the sub-pixel units is located on one of the sub-pixel regions; the gate lines are located on the first wiring regions and are electrically connected with the sub-pixel units; the data lines are located on the second wiring regions and are electrically connected with the sub-pixel units; the data lines and the gate lines are insulated from each other and orthographic projections of the data line and the gate line on the first substrate intersect with each other; the data line has an alignment part, and an orthographic projection of the alignment part on the first substrate is located in a region where the first wiring region and the second wiring region intersect, wherein the data line further has main line parts located on opposite sides of the alignment part in a column direction, the data line further has a transition part located between the main line part and the alignment part, and a size of the transition part in a row direction is larger than that of the main line part in the row direction, and smaller than that of the alignment part in the row direction; and a spacer disposed on a side of the alignment part away from the array substrate, an orthographic projection of the spacer on the first substrate is located within an orthographic projection of the alignment part on the first substrate, wherein barrier walls located on opposite sides of the spacer in the column direction are further provided on the first substrate, and a distance between the barrier wall and the spacer is a second distance between 15 μm and 40 μm, and wherein the first wiring area is further provided with a common line, and an overlapping portion of orthographic projections of the transition part and the common line on the first substrate forms another barrier wall.

13. The display device according to claim 12, wherein an orthographic projection of the main line part on the first substrate and an orthographic projections of the first wiring area on the first substrate do not overlap, and a size of the main line part in the row direction is smaller than that of the alignment part in the row direction.

14. The display device according to claim 13, wherein, in a direction from a side of the alignment part close to the main line part to a center of the alignment part, the size of the alignment part in the row direction gradually increases.

15. The display device according to claim 13, wherein:
a distance between an edge of the orthographic projection of the spacer on the first substrate and an edge of the orthographic projection of the alignment part on the first substrate is a first distance; and a ratio between the first distance and the size of the main line part of the data line in the row direction is 50% to 100%.

16. The display device according to claim 13, wherein:
two gate lines are provided on the first wiring area, and each of the gate lines is electrically connected to at least part of the sub-pixel units in an adjacent row of the sub-pixel units; and the orthographic projection of the alignment part on the first substrate is located between orthographic projections of the two gate lines on the first substrate.

17. The display device according to claim 16, wherein a ratio between the second distance and the size of the main line part of the data line in the row direction is 2.5 to 8.

18. The display device according to claim 17, wherein:
orthographic projections of the transition part and the gate line on the first substrate overlap, and an overlapping position is defined as a blocking position; and the barrier wall comprises a portion of the transition part located at the blocking position and a portion of the gate line located at the blocking position.

19. The display device according to claim 13, wherein the alignment part is electrically connected with two adjacent columns of sub-pixel units.

20. The display device according to claim 13, further comprising a color filter substrate, wherein the color filter substrate comprises a second substrate located on a side of the spacer away from the array substrate and a shielding layer located on a side of the second substrate close to the array substrate, and the shielding layer has an intersecting shielding part, first shielding parts located on opposite sides of the intersecting shielding part in the row direction, and second shielding parts located on opposite sides of the intersecting shielding part in the column direction, wherein:
an orthographic projection of the intersecting shielding part on the first substrate at least covers an intersection area of the first wiring area and the second wiring area, and an orthographic projection of the first shielding part on the first substrate at least covers the first wiring area and does not overlap with the second wiring area, and an orthographic projection of the second shielding part on the first substrate at least covers the second wiring area and does not overlap with the first wiring area; and a size of the intersecting shielding part in the column direction is larger than that of the first shielding part in the column direction, and a size of the intersecting shielding part in the row direction is larger than that of the second shielding part in the row direction.

* * * * *